United States Patent [19]

Rehm et al.

[11] Patent Number: 4,533,878
[45] Date of Patent: Aug. 6, 1985

[54] AMPLIFIER COMPRISING ECL LOGIC GATE BIASED BY ANOTHER ECL LOGIC GATE

[75] Inventors: Hans Rehm, Munich; Horst Breitenfeld, Gauting, both of Fed. Rep. of Germany

[73] Assignee: Siemens Aktiengesellschaft, Berlin and Munich, Fed. Rep. of Germany

[21] Appl. No.: 478,150

[22] Filed: Mar. 23, 1983

[30] Foreign Application Priority Data

Apr. 1, 1982 [DE] Fed. Rep. of Germany ....... 3212188

[51] Int. Cl.³ .......................... H03F 3/195; H03F 3/45
[52] U.S. Cl. ..................................... 330/261; 330/310; 375/3; 307/455
[58] Field of Search ............... 375/3, 4; 330/261, 310, 330/311; 307/455

[56] References Cited

U.S. PATENT DOCUMENTS

| | | | |
|---|---|---|---|
| 3,648,064 | 3/1972 | Mukai et al. | 307/213 |
| 3,906,212 | 9/1975 | Poguntke | 307/455 |
| 3,918,004 | 11/1975 | Shimizu et al. | 330/261 |
| 3,968,399 | 7/1976 | Jarrett | 315/200 |
| 4,019,048 | 4/1977 | Maione et al. | 250/199 |
| 4,146,845 | 3/1979 | Lunquist | 330/261 |
| 4,172,999 | 10/1979 | Leidich | 330/261 |
| 4,274,112 | 6/1984 | Leysieffer et al. | 358/181 |
| 4,277,756 | 7/1981 | Kriedt et al. | 330/261 |

FOREIGN PATENT DOCUMENTS 3010535 9/1981 Fed. Rep. of Germany .......... 375/4

OTHER PUBLICATIONS

"Amplifiers", McGraw Hill Encyclopedia of Science and Technology; 1971; vol. 1, pp. 378, 380.
"Fiber-Optics Detector and Amp on One Chip Fight RFI and EMI", Mennie, Electronic Design, vol. 27, No. 21, (Oct. 11, 1979), pp. 29-30.

Primary Examiner—Robert L. Griffin
Assistant Examiner—Raymond C. Glenny
Attorney, Agent, or Firm—Hill, Van Santen, Steadman & Simpson

[57] ABSTRACT

A circuit for amplifying electrical signals, particularly for devices for transmitting frequency-modulated emitter coupled logic (ECL) broad-band signals by means of coaxial lines utilizes a plurality of ECL logic elements as amplifier stages. The input of each logic element is connected to a bias voltage and is charged by means of a coupling capacitor with the signal to be amplified. The circuit amplifies electrical signals to ECL level with an improved signal pulse duty factor.

6 Claims, 9 Drawing Figures

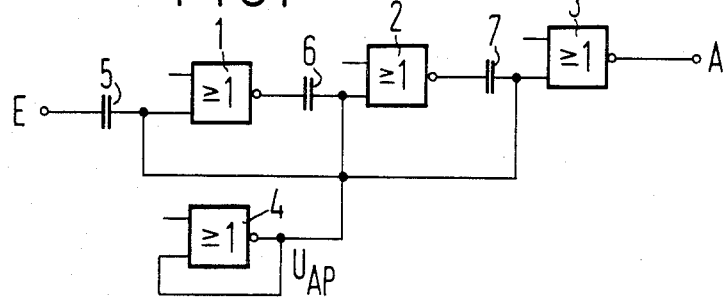
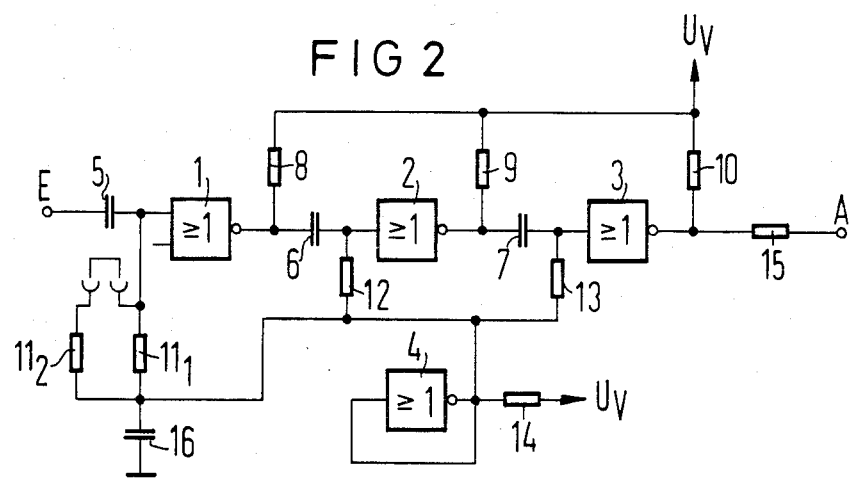
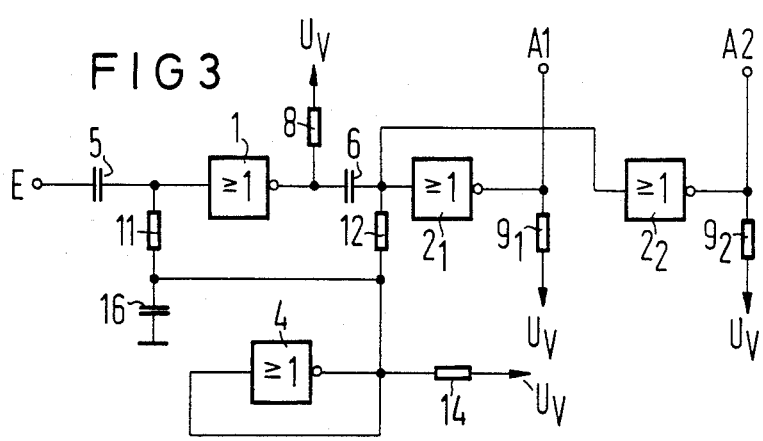

AMPLIFIER COMPRISING ECL LOGIC GATE BIASED BY ANOTHER ECL LOGIC GATE

BACKGROUND OF THE INVENTION

1. Field of the Invention

The present invention relates to circuits for amplifying electrical signals, and in particular to a circuit for amplifying electrical signals in a device for transmitting frequency-modulated emitter coupled logic (ECL) broad-band signals by means of coaxial lines.

2. Description of the Prior Art

A circuit for selected through-connection or inhibition of broad-band width signals is disclosed in U.S. Pat. No. 4,274,112, the electronic switches therein being designed as logic elements in ECL technology. Frequency-modulated signals having a broad band width, particularly carriers modulated by video signals, are transmitted by means of these logic elements.

ECL signals may be attenuated by longer coaxial cables of, for example, 100 meters in length, such that a line receiver is required at the end of the cable, the line receiver amplifying the attenuated signals up to ECL level. If the signal pulse duty factor or the $a_{k2}$ harmonic value is to be improved, or at least not permitted to deteriorate, a relatively involved circuitry is required or alternatively an undesirable operating point balance is necessary.

Generally, symmetrical cables having symmetrical line receivers are utilized for digital ECL transmission over longer distances. This is not practical, however, without further circuitry particularly in the case of rectangular FM transmission. Moreover, such line receivers are galvanically driven in push-pull mode, and produce no improvement of the signal pulse duty factor.

SUMMARY OF THE INVENTION

It is an object of the present invention to provide a circuit for amplifying electrical signals for devices for transmitting frequency-modulated ECL broad band signals via coaxial lines which involves as minimum circuit outlay as possible as well as amplifying the signals to a level suitable for ECL logic elements.

It is another object of the present invention to provide such a circuit for amplifying frequency modulated ECL signals which effects an improvement in the signal pulse duty factor.

The above objects are inventively achieved in a circuit including at least one amplifier stage formed by an ECL logic element, the input of this amplifier stage being electrically connected to a bias voltage source and being capacitively connected to a signal voltage source, with a further ECL logic element serving as the bias voltage source, that further ECL logic element having its output connected to one of its inputs. A circuit of this type can be constructed of standard ECL logic elements and can therefore be realized with a particularly low circuit outlay. A further advantage of the circuit is that an improvement in the signal pulse duty factor, or an increase in the $a_{k2}$ harmonic ratio, is achieved by driving the logic element by means of a capacitive coupling. The harmonic distortion attenuation $a_{k2}$ (natural logarithm of the reciprocal of the distortion factor) refers to distortion products of the second order, that is, to the first harmonic. The operating point voltage can be derived by means of a logic element such that changes in temperature and supply voltage as well as unit or component scatter are negligible and the necessity of precisely maintaining an operating point balance is eliminated. Component scatter is caused by differences in the electrical properties varying from component to component, even among components of the same type. Such scatter lies in a range determined by the tolerances which are specified for each component.

A particularly favorable operating point for the circuit can be derived by maintaining the bias voltage emitted by the bias voltage source at least approximately equal to the mean voltage value in the linear amplification range of the transfer characteristic of the ECL logic element serving as the amplifier stage. In particular, the logic element serving as the bias voltage source is formed by a NOR element having an output connected to one of its inputs.

In a further embodiment of the invention, the logic element serving as the bias voltage source is also formed by a NOR element having an output connected to one of its inputs. Standard integrated circuits can be particularly advantageously exploited for constructing the circuit in this manner.

In another embodiment of the invention, three of four logic elements of a standard ECL module are connected in series as amplifier stages. In another embodiment, one of four logic elements of an ECL module serves as a pre-amplifier stage, and two other logic elements in the module are final amplifier stages connected thereto. Two-stage and three-stage line receivers can be realized in a particular simple manner by this embodiment.

Preferably at least the logic element forming the bias voltage source includes a means for generating a reference voltage.

As a result of the advantages of this circuit discussed above, the circuit is particularly well suited for use as an asymmetrical HF line receiver in components of optical broad band networks, particularly in conjunction with the transmission of FM signals in a fundamental channel up to 60 MHz, particularly 10 through 60 MHz, wherein coaxial cables of different lengths, up to a maximum of 100 meters, are provided such that rather greatly attenuated reception signals may occur which are to be respectively amplified to ECL level with low distortion of the $a_{k2}$ harmonic.

Another particularly advantagous use for the circuit disclosed and claimed herein is for reducing the first harmonic in any device wherein frequency modulated signals conducted over ECL logic elements are to be transmitted in frequency-division multiplex.

BRIEF DESCRIPTION OF THE DRAWINGS

FIG. 1 is a circuit diagram for a circuit for amplifying electrical signals by means of ECL logic elements illustrating the principles of the present invention;

FIG. 2 is a circuit diagram for a three-stage circuit for amplifying electrical signals by means of ECL logic elements constructed in accordance with the principles of the present invention;

FIG. 3 is a circuit diagram for a circuit for amplifying electrical signals constructed in accordance with the principles of the present invention having a pre-amplifier stage and two final amplifier stages;

DESCRIPTION OF THE PREFERRED EMBODIMENTS

Figure 4:
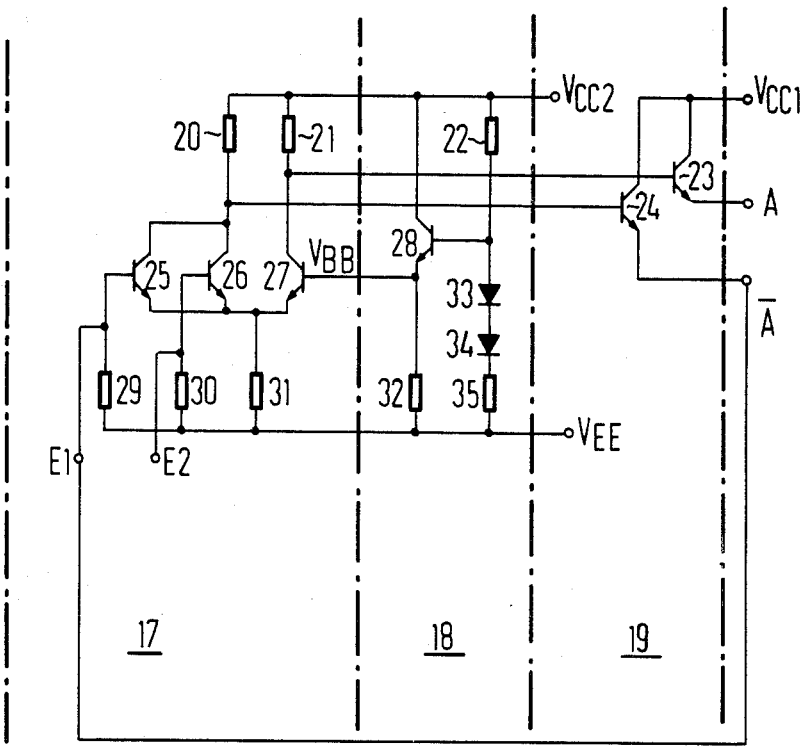
FIG. 4 is a circuit diagram for an OR-NOR logic element of an ECL module suitable for use in a circuit constructed in accordance with the principles of the present invention.

A circuit is shown in FIG. 1 for amplifying ECL signals which can be realized by means of four logic elements in a module MC10102 of the circuit family 10K (ECL 10,000). The circuit includes NOR elements 1, 2 and 3 which are connected in series with capacitors 6 and 7. The input of the NOR element 1 is preceded by a capacitor 5. The NOR element 4 serves for generating the operating point voltage $U_{AP}$ which is directly supplied to the respective inputs of the NOR elements 1, 2 and 3. The desired operating point voltage is thus automatically set at the output of the NOR element 4 because that output is directly connected to one of the inputs of the NOR element 4.

A further embodiment of the circuit shown in FIG. 1 is illustrated in FIG. 2 wherein resistors $11_1$, 12 and 13 are interconnected between the NOR element 4 and the inputs of the respective NOR elements 1, 2 and 3. The resistor $11_1$ preceding the input of the input stage can be set by means of a parallel connection with another resistor $11_2$. The output of the NOR element 4 is connected to a supply voltage via a resistor 14, and to ground via a capacitor 16.

With the NOR element 1 in FIG. 2 serving as an input stage, the input is conducted via the capacitor 5 to the input of the circuit arrangement. The outputs of the NOR elements 1, 2 and 3 are connected via respective resistors 8, 9 and 10 to the supply voltage $U_V$ for an associated output emitter follower. The power supply for the module itself is not illustrated in the drawing. A resistor 15 is interconnected between the output of the NOR element 3 and the output of the circuit.

The resistors 8, 9 and 10 are load resistors for the output emitter follower, and the resistor 15 serves for matching to a following line having a defined characteristic impedance.

A further embodiment of the circuit is shown in FIG. 3 wherein a first of the four logic elements of the ECL module is employed as a pre-amplifier stage, and a second and a third of the logic elements of the module are utilized as respective output amplifier stages, and a fourth logic element of the module is utilized as a bias voltage source. Because the inputs of the output amplifier stages $2_1$ and $2_2$ are directly connected to each other, a single resistor 12 is provided for the feed of the bias voltage to these amplifier stages.

In contrast to the embodiment shown in FIG. 2, the outputs of the NOR elements $2_1$ and $2_2$ shown in FIG. 3 are respectively directly connected to outputs $A_1$ and $A_2$ of the circuit.

Further details of an OR-NOR element suitable for use as an amplifier stage or a bias voltage source in the circuit disclosed and claimed herein are shown in FIG. 4. Such a NOR element contains a differential amplifier 17 having transistors 25 and 26 on one side and a transistor 27 on the other side. The transistors 25, 26 and 27 are all connected to an emitter resistor 31. The base terminals of the transistors 25 and 26 are respectively connected to the inputs of the NOR element and the base of the transistor 27 is connected to the output of an internal bias voltage source 18. The internal bias voltage source 18 consists of a transistor 28 having a base connected to a voltage divider consisting of a resistor 22, diodes 33 and 34, and a resistor 35. The resistor 32 is disposed in the emitter branch of the bias voltage source 18. The reference voltage source 18 emits a reference voltage $V_{BB}=1.175$ volts to the differential amplifier 17.

The collectors of transistors 26 and 27 are connected to a collector supply voltage $V_{CC2}$ via resistors 20 and 21 and to the respective base terminals of output transistors 24 and 23 in an output stage 19. The transistors 23 and 24 are each connected to a collector supply voltage $V_{CC1}$ and their emitters form the outputs A and $\overline{A}$ of the complete circuit.

The differential amplifier serves as a limiting amplifier for the signal to be amplified. Utilizing the internal reference voltage source, as shown in FIG. 4, the NOR output $\overline{A}$ is directly connected to one of the two inputs $E_1$ or $E_2$. The internal reference voltage $V_{BB}$ is automatically set at the NOR output $\overline{A}$ by means of such inverse feedback. In some optical broad band networks, it is preferable to employ frequency modulation. In such instances, the FM signal, insofar as it is not combined with other signals to form a frequency-division multiplex signal, cannot be amplitude limited such that a so-called rectangular FM signal results. By utilizing ECL technology, many functions in the circuit components, even in the switching matrix, can be realized utilizing standard ECL modules. Because of spatial conditions, transmission of such ECL signals occurs via links up to 100 meters long in the fundamental channel 30 MHz±17 MHz.

In the transmission of FM signals, longer lines are operated which are matched at both ends for minimizing reflection. Additionally, coaxial cables may be employed because symmetrical transmission of the HF signals by means of, for example, twisted cable pairs, is not possible without further difficulties of cross-talk. In devices of this type it is preferable to amplify the signals to ECL level by means of a line receiver, particularly if further ECL circuits are utilized elsewhere in the system. Given the use of standard ECL drivers, matching at the transmission side produces an attenuation of approximately 5 dB. In addition, the attenuation of the coaxial cable (for example a 100 meter long cable RG 316/U) is approximately 16 dB at a frequency $f=30$ MHz. Thus, the voltage gain must, in this instance amount to $v_U \geq 21$ dB.

Figure 7:
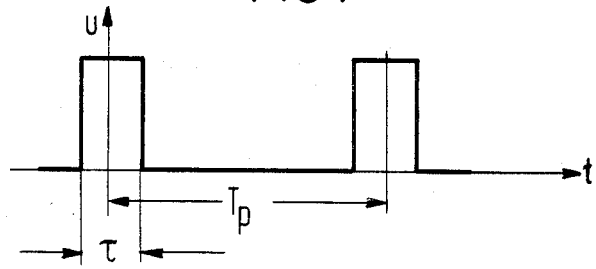
FIG. 7 illustrates an FM signal with a pulse duty factor $T_p/t$.

According to the specifications in DIN 45402, the pulse duty factor $v_t = T_p/\tau$ (See FIG. 7) given rectangular signals is in direct relationship with the distortion products of the second order, or with the formation of the first harmonic.

The first harmonic, which may disrupt the next channel given a following transmission in the frequency-division multiplex signal, insofar as its level spacing relative to the fundamental is not greater than approximately 20 dB, is even more pronouncedly formed the greater the pulse duty factor deviates from the value 2.

Because the FM signal traverses a larger number of ECL gates or ECL logic elements during transmission, particularly in switching matrices and/or distribution networks or optical broad band networks, the pulse duty factor may be unfavorably deteriorated by the tolerances of the gate thresholds.

For the above reasons, the line receiver should effect an improvement in the pulse duty factor in order to achieve the required spacing of the first harmonic of preferably more than 20 dB.

A solution to the problem of preventing deterioration of the pulse duty factor, and in fact improving the pulse duty factor, utilizing conventional amplifier stages with discrete components generally requires balancing the various circuits and the use of a comparator with an ECL output such as, for example, model AM 685. Such a solution requires relatively complex circuitry and a corresponding increase in manufacturing costs.

The necessary improvement in the pulse duty factor can be achieved within the framework of the amplifier circuit disclosed and claimed herein utilizing an integrated circuit of the ECL 10K series, particularly MC 10102. In accordance with the principles of the present invention, the first three gates of such a module are connected in series with capacitive coupling and an operating point voltage is supplied to each gate input, the operating point voltage being derived from the fourth gate of the same module. A circuit arrangement for such a line proceeds from that shown in FIG. 1.

The module MC 10102 consists of four NOR gates having two respective inputs in ECL technology. One of the gates additionally exhibits an OR output; such a circuit proceeds from FIG. 4. Using such a module for the gates in the embodiment of FIG. 1, the unconnected inputs of those gates assume a "low" status.

Figure 5:
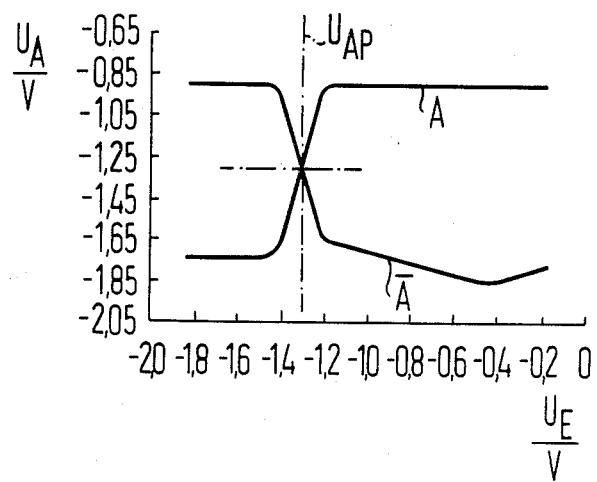
FIG. 5 is a diagram of the transfer characteristics of the logic element shown in FIG. 4.
Figure 6:
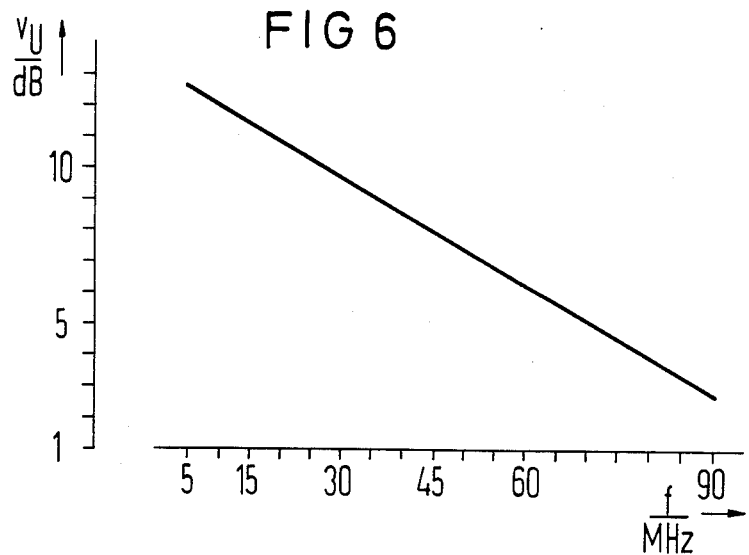
FIG. 6 illustrates the frequency dependency of the voltage gain of the logic element shown in FIG. 4.

The transfer characteristic of a MECL 10K gate is shown in FIG. 5 and the frequency-dependent voltage gain measured in the linear range is shown in FIG. 6.

As precise as possible a setting of the operating point is necessary to meet the system-conditioned demands. The most favorable operating point voltage $U_{AP}$ is the mean voltage value in the linear amplification range of the transfer characteristic as shown in FIG. 5. Only at this setting of the bias voltage $U_{AP}$ is the maximum possible voltage gain exploited, and only at this point is the pulse duty factor $v_t = 2$ of an input signal not deteriorated.

The operating point voltage $U_{AP}$ is generated by means of the gate 4 shown in FIG. 4 by connecting the inverting output $\overline{A}$ to the input $E_1$. A temperature stabilized internal module reference voltage, which would otherwise not be externally accessible, can be used to advantage by means of this inverse feedback. Frequency-dependent inverse feedback measures, which are otherwise standard for stabilizing the operating point in amplifiers and comparators and which are significantly more complex, would be required particularly when a plurality of gate stages are needed because a corresponding inverse feedback stage would be needed for each gate stage.

Because one of the four gates of the integrated circuit discussed above, serves for generating the bias voltage in each line receiver, discontinuities in the gain characteristics caused by component, temperature and supply voltage, tolerances and variations are satisfactorily compensated.

Figure 8:
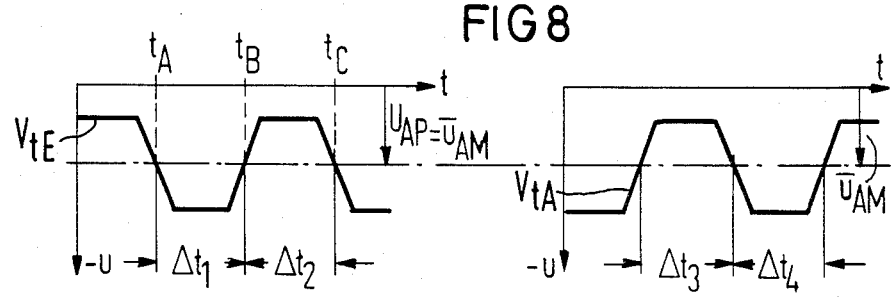
FIG. 8 illustrates the shapes of the input signal and the output signal for a circuit constructed in accordance with the principles of the present invention given a pulse duty factor $v_t=2$.

Because DC components of the input signal are blocked by the capacitive couplings, the individual stages of the line receiver amplify by the set operating point voltage $U_{AP}$, that is, input signals with a pulse duty factor $v_t = 2$ oscillate with symmetric amplitudes about $U_{AP}$ ($U_{AP} = \overline{u}_{AM}$ as shown in FIG. 8), after each capacitive coupling at the amplifier input, so that a duty pulse factor of $v_t = 2$ also holds for the output signal.

The various signal shapes given a pulse duty factor $v_t = 2$ are shown in FIG. 8. The input signal is shown at the left and the output signal is shown at the right. In FIG. 8, $\overline{u}_{AM}$ designates the mean amplitude value, $U_{AP}$ designates the operating point voltage, $v_{tE}$ designates the pulse duty factor at the gate input, $v_{tA}$ designates the pulse duty factor at the gate output, and $t_A$, $t_B$, $t_C$ and $t_D$ designate gate change-over times. In FIG. 8 $\Delta t_1 = \Delta t_3$; $\Delta t_2 = \Delta t_4$. In FIG. 8, $v_{tE} = v_{tA}$.

Figure 9:
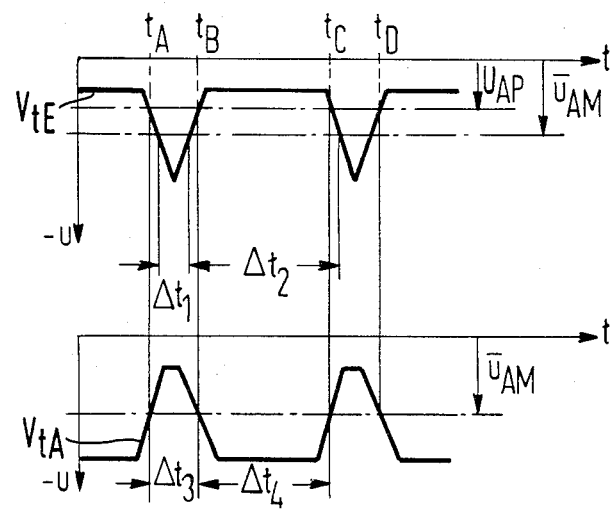
FIG. 9 illustrates the manner of improvement of the pulse duty factor exhibited by the circuit constructed in accordance with the principles of the present invention.

If the pulse duty factor of the input signal deviates from the value 2 ($v_t \neq 2$), the input signal then does not oscillate with symmetric amplitudes around $U_{AP}$ ($U_{AP} \neq \overline{u}_{AM}$) after the capacitive coupling. As a result, and also due to the finite edge steepness of the signal, an improvement of the pulse duty factor and thus of the $a_{k2}$ value is achieved. Such an improved pulse duty factor is shown in FIG. 9 wherein it can been seen that because $\Delta t_3 > \Delta t_1$ and $\Delta t_4 < \Delta t_2$, $v_{tA}$ is better than $v_{tE}$.

Although modifications and changes may be suggested by the those skilled in the art, applicants wish to embody within the patent warranted hereon all changes and modifications as reasonably and properly come within the scope of their contribution to the art.

We claim as our invention:

1. A circuit for amplifying electrical signals in a device for transmitting frequency-modulated emitter coupled logic (ECL) signals via coaxial lines, said circuit comprising:
   at least one amplifier stage formed by an ECL logic element, said amplifier stage having an input directly connected to a bias voltage source and capacitively connected to a signal voltage source; and
   a further ECL logic element functioning as said bias voltage source, said further ECL logic element having an output and an input directly connected together, said ECL logic element forming said amplifier stage and said ECL logic element functioning as said bias voltage source being identical logic elements and components of a single ECL module.

2. A circuit as claimed in claim 1 wherein said ECL logic element forming said amplifier stage has a transfer characteristic exhibiting a linear amplificiation range, and wherein said bias voltage emitted by said bias voltage source is substantially equal to the mean voltage value in said linear amplification range.

3. A circuit as claimed in claim 1 wherein said ECL logic element functioning as said bias voltage source is a NOR element having an output connected to one of its inputs.

4. A circuit as claimed in claim 1 having three amplifier stages each formed by an ECL logic element and wherein said three amplifier stages are formed by three ECL logic elements of a single ECL module.

5. A circuit as claimed in claim 1 further comprising a pre-amplifier stage formed by an ECL logic element and two final amplifier stages formed by separate ECL logic elements connected to said pre-amplifier stage, and wherein said ECL logic elements forming said pre-amplifier and amplifier stages are components of a single ECL module.

6. A circuit as claimed in claim 1 wherein said device for transmitting frequency-modulated ECL broad band signals transmits said signals in frequency-division multiplex and wherein said circuit is connected to said device for reducing the first harmonic in said frequency-modulated signal.

* * * * *